United States Patent
Agarwal et al.

(10) Patent No.: US 11,854,600 B2
(45) Date of Patent: Dec. 26, 2023

(54) WRITE REQUEST THRESHOLDING

(71) Applicant: Micron Technology, Inc., Boise, ID (US)

(72) Inventors: Nikesh Agarwal, Bangalore (IN); Laurent Isenegger, Morgan Hill, CA (US); Kirthi Ravindra Kulkarni, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 17/412,037

(22) Filed: Aug. 25, 2021

(65) Prior Publication Data

US 2023/0062167 A1    Mar. 2, 2023

(51) Int. Cl.
*G11C 11/4076* (2006.01)
*G11C 11/4096* (2006.01)
*G11C 11/4093* (2006.01)
*G11C 11/4078* (2006.01)

(52) U.S. Cl.
CPC ...... *G11C 11/4076* (2013.01); *G11C 11/4078* (2013.01); *G11C 11/4093* (2013.01); *G11C 11/4096* (2013.01)

(58) Field of Classification Search
CPC ............ G11C 11/4076; G11C 11/4078; G11C 11/4093; G11C 11/4096
USPC ...................................................... 365/233.1
See application file for complete search history.

(56) References Cited

U.S. PATENT DOCUMENTS

| | | |
|---|---|---|
| 10,430,084 B2 | 10/2019 | Goss et al. |
| 10,708,189 B1 | 7/2020 | Agrawal et al. |
| 11,100,963 B1 | 8/2021 | Wu et al. |
| 2016/0093344 A1* | 3/2016 | Halbert ............... G11C 7/1063 711/105 |
| 2019/0286364 A1* | 9/2019 | Gavens ................ G06F 3/0655 |

* cited by examiner

*Primary Examiner* — Hoai V Ho
*Assistant Examiner* — Minh Dinh
(74) *Attorney, Agent, or Firm* — Brooks, Cameron & Huebsch, PLLC

(57) ABSTRACT

A method includes receiving a write request to a write queue of a host having the write queue and a read queue; initiating a write queue timer upon receiving the write request to the write queue of the host, wherein the write queue timer has a write queue timer expiry threshold value; and executing one or more write requests when the write queue timer reaches the write queue timer expiry threshold value.

18 Claims, 8 Drawing Sheets

WRITE REQUEST THRESHOLDING

TECHNICAL FIELD

Embodiments of the disclosure relate generally to computing systems, and more specifically, relate to computing system write request thresholding.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, ferroelectric random access memory (FeRAM), and resistance variable memory such as phase change random access memory (PCRAM), resistive random access memory (RRAM), and magnetoresistive random access memory (MRAM), such as spin torque transfer random access memory (STT RAM), among others.

Memory devices can be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller can be used to manage the transfer of data, commands, and/or instructions between the host and the memory devices.

BRIEF DESCRIPTION OF THE DRAWINGS

The present disclosure will be understood more fully from the detailed description given below and from the accompanying drawings of various embodiments of the disclosure.

FIG. 3-1, 3-2 is a flow diagram corresponding to write request thresholding in accordance with some embodiments of the present disclosure.

DETAILED DESCRIPTION

Figure 1:
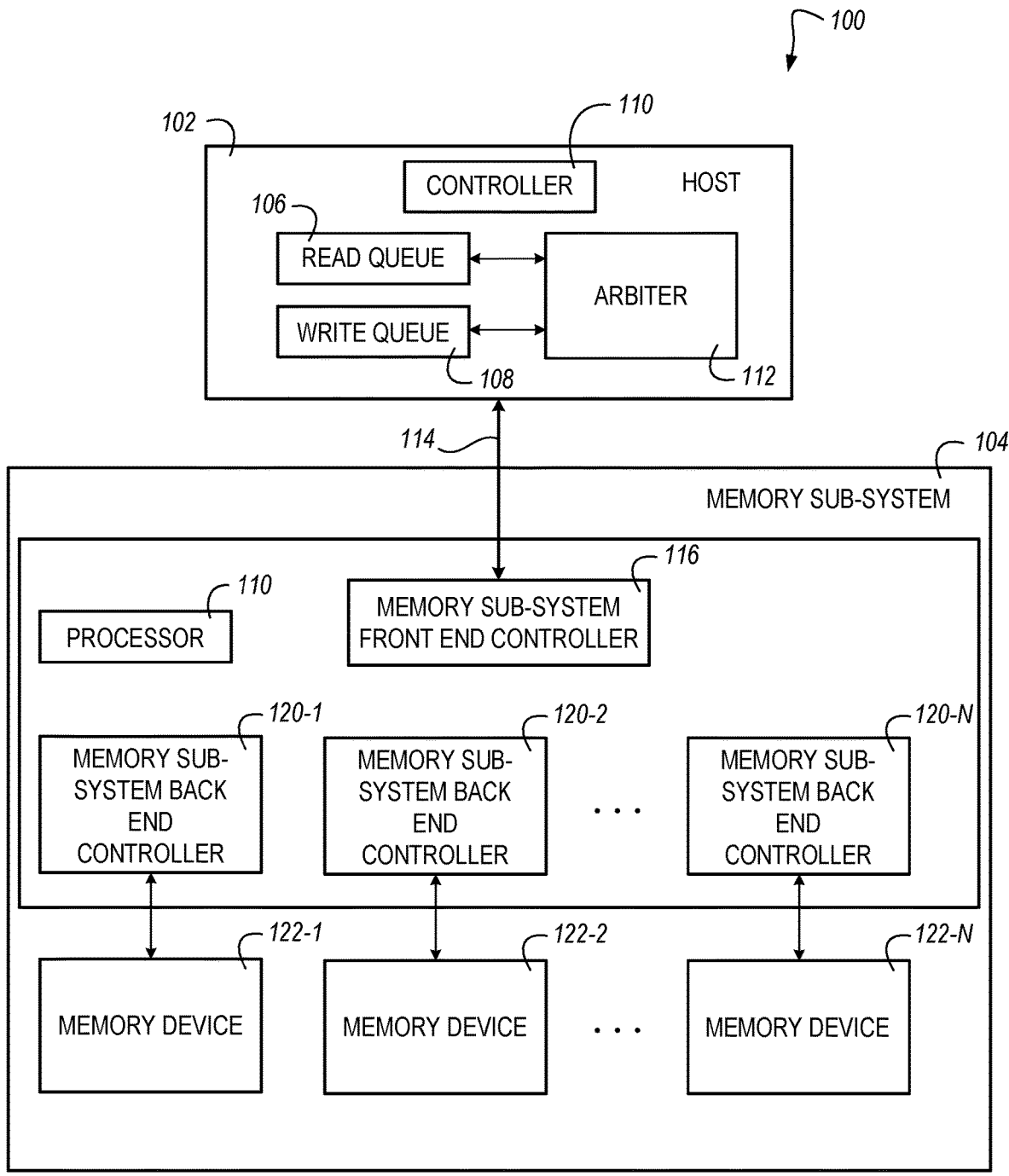
FIG. 1 illustrates a portion of an example computing system that includes a host and a memory sub-system in accordance with some embodiments of the present disclosure.

Aspects of the present disclosure are directed to systems, apparatuses, and methods related to write request thresholding. A computing system can include a host computing device and a memory sub-system. The memory sub-system can be a storage system, storage device, a memory module, or a combination of such. The host computing device can generate requests to read or write data from and/or to the memory sub-system. In general, a host system can utilize a memory sub-system that includes one or more components, such as memory devices that store data. The host system can provide data to be stored at the memory sub-system and can request data to be retrieved from the memory sub-system.

Read latency can refer to a time interval between receiving (e.g., from a controller) a read command to access stored data and providing (e.g., to a host) the data. Reducing read latency can be considered a beneficial performance improvement.

Previously, a number of approaches have been utilized to manage read requests and write requests. For instance, a First In First Out (FIFO) approach has previously been utilized to manage read requests and write requests. For the FIFO approach, equal priority is given to both read requests and write requests. In other words, requests are executed in the order that received. However, because read requests and write requests are equally prioritized, the FIFO approach generally does not address read latency (e.g., when a number of write requests are received prior to, and are thus executed prior to a number of read requests).

Further, a Read Priority approach has previously been utilized to manage read requests and write requests. For the Read Priority approach, read requests are given priority as compared to write requests. Providing read requests priority as compared to write requests can reduce read latency; however, when read requests are regularly received the write requests will not be timely executed (which can be referred to as stalling write requests and/or write starvation). Stalling write requests can be detrimental to overall system performance. Additionally, write data that is not timely executed can be lost (e.g., stalled write data can be lost due to an event such as a power loss).

Aspects of the present disclosure address the above and other deficiencies by write request thresholding. Utilizing write request thresholding, as discussed herein, can reduce read latency, while avoiding write starvation. For example, embodiments provide that read requests are received to a read queue and write requests are received to a write queue. The write queue has a write queue lower threshold value and a write queue upper threshold value. Additionally, a write queue timer can be initiated when a write request is received to the write queue. As discussed further herein, embodiments provide that read requests received to the read queue can be prioritized, as compared to write requests received to the write queue, until the write queue timer reaches a write queue timer expiry threshold value and/or the write queue pending write requests count reaches the write queue upper threshold value. As such, read latency can be reduced, while write starvation is avoided.

FIG. 1 illustrates a portion of an example computing system 100 that includes a host 102 and a memory sub-system 104 in accordance with some embodiments of the present disclosure. The host 102 can include a read queue 106, a write queue 108, a controller 110, and an arbiter 112.

The host 102 can include a host memory and a processor (not illustrated). The host 102 can be a host system such as a personal laptop computer, a desktop computer, a digital camera, a smart phone, a memory card reader, and/or internet-of-thing enabled device, among various other types of hosts. One of ordinary skill in the art will appreciate that "a processor" can intend one or more processors, such as a parallel processing system, a number of coprocessors, etc.

The read queue 106 can receive (e.g., from a traffic generator, not illustrated) read requests that can be executed to access data from the memory sub-system 104. The write queue 108 can receive (e.g., from a traffic generator, not illustrated) write requests that can be executed to store data at the memory sub-system 104.

The controller 110 (e.g., host controller) is configured to cause performance of a number of operations, as discussed further herein. For example, the controller 110 is configured to cause performance of write request thresholding.

The arbiter 112 can be configured to perform various functions, such as coordinating performance of operations associated with commands executed on the host 102 and/or the memory sub-system 104. In some embodiments, the arbiter 112 can be utilized as a sequencer (e.g., sequence commands to be issued to the host 102 and/or the memory sub-system 104).

As illustrated in FIG. 1, the host 102 can be coupled to the memory sub-system 104 via an interface 114. The interface 114 can be any type of communication path, bus, or the like that allows for information to be transferred between the host 102 and the memory sub-system 104. Non-limiting examples of interfaces can include a peripheral component interconnect (PCI) interface, a peripheral component interconnect express (PCIe) interface, a serial advanced technology attachment (SATA) interface, and/or a miniature serial advanced technology attachment (mSATA) interface, among others. However, in at least one embodiment, the interface 114 is a PCIe 5.0 interface that is compliant with the compute express link (CXL) protocol standard. Accordingly, in some embodiments, the interface 114 can support transfer speeds of at least 32 gigatransfers per second. One or more embodiments the interface 114 can be configured as a single port; however, embodiments are not so limited. For instance, in a number of embodiments, the interface 114 can include a plurality of physical conductive paths, such as wires and/or signal traces, which may be referred to herein as "lanes," for consistency with CXL terminology. In some embodiments, the interface 114 can include eight lanes or 16 lanes, among others.

In some embodiments, the system 100 can be a Compute Express Link (CXL) compliant system (e.g., the system 100 can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface.

The memory sub-system 104 can include a memory sub-system front end controller 116 (e.g., a front end portion) and a memory sub-system back end controller 120-1, 120-2, . . . 120-N (e.g., a back end portion). One or more embodiments provide that the memory sub-system front end controller 116 includes an interface to couple the memory sub-system 104 to the host 102 through the interface 114. The memory sub-system front end controller 116 can use CXL protocol layers, including CXL.io and CXL.mem (e.g., to couple the memory sub-system 104 to the host 102, such as the host memory controller 110 that is a CXL compliant controller). One or more embodiments provide that the memory sub-system front back controller 120-1, 120-2, . . . 120-N can be utilized for performance of operations associated with memory accesses.

While not illustrated in FIG. 1, one or more embodiments provide that the memory sub-system 104 can include a memory sub-system central controller (e.g., a middle portion). One or more embodiments provide that the memory sub-system central controller can be utilized for performance of operations associated with encryption/decryption, and/or media management error correction.

The memory sub-system 104 can include a processor 110. The processor 110 can include one or more processors, such as a parallel processing system, a number of coprocessors, etc.

The memory sub-system 104 can include media, such as one or more memory devices (e.g., memory devices 122-1, 122-2, . . . 122-N). The memory device(s) 122-1, 122-2, . . . 122-N can provide main memory for the computing system 100 or can be used as additional memory or storage throughout the computing system 100. In some embodiments, each of the memory devices 122-1, 122-2, . . . 122-N can be coupled to a respective back end controller 120-1, 120-1, . . . 120-N in a 1:1 correspondence, as shown in FIG. 1, although embodiments are not limited to this specific example and one or more of the back end controllers 120-1, 120-2, . . . 120-N can be coupled to multiple memory devices 122-1, 122-2, . . . 122-N.

The memory devices 122-1, 122-2, . . . 122-N can be various types of memory devices. For instance, the memory device can include RAM, ROM, DRAM, SDRAM, PCRAM, RRAM, and flash memory, among others. In embodiments in which the memory device 122 includes persistent or non-volatile memory, the memory device 122 can be flash memory devices such as NAND or NOR flash memory devices. Embodiments are not so limited; however, and the memory device 122 can include other non-volatile memory devices such as non-volatile random-access memory devices (e.g., non-volatile RAM (NVRAM), ReRAM, ferroelectric RAM (FeRAM), MRAM, PCRAM), "emerging" memory devices such as a ferroelectric RAM device that includes ferroelectric capacitors that can exhibit hysteresis characteristics.

As an example, a FeRAM device can include ferroelectric capacitors and can perform bit storage based on an amount of voltage or charge applied thereto. In such examples, relatively small and relatively large voltages allow the ferroelectric RAM device to exhibit characteristics similar to normal dielectric materials (e.g., dielectric materials that have a relatively high dielectric constant) but at various voltages between such relatively small and large voltages the ferroelectric RAM device can exhibit a polarization reversal that yields non-linear dielectric behavior.

Figure 2:
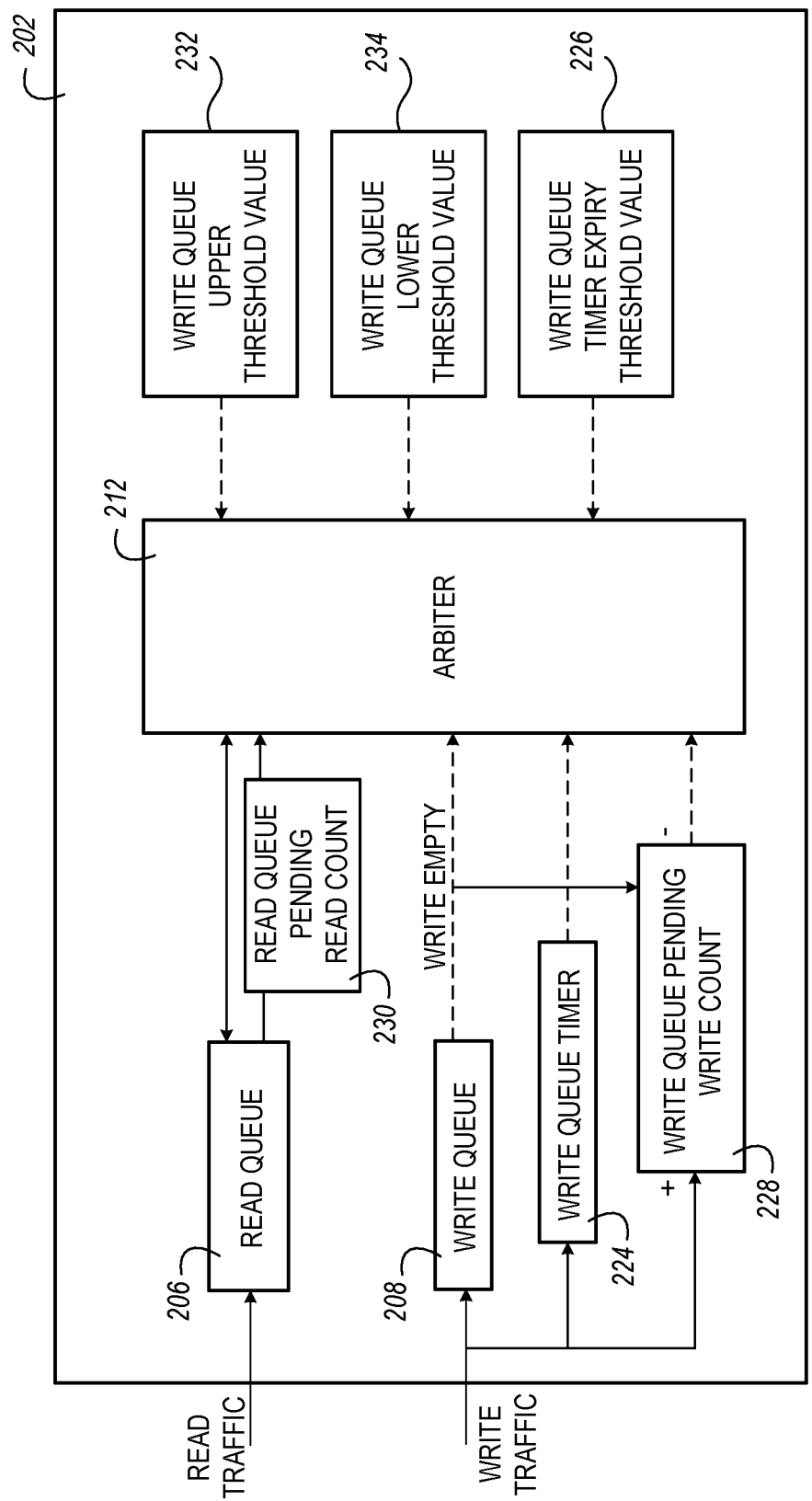
FIG. 2 illustrates a portion of an example computing system in accordance with some embodiments of the present disclosure.

FIG. 2 illustrates a portion of an example computing system in accordance with some embodiments of the present disclosure. As shown in FIG. 2, the host 202 includes the read queue 206, the write queue 208, and the arbiter 212, as previously discussed. Further, as shown in FIG. 2, the host 202 can include a number of registers (e.g., write queue timer 224, write queue timer expiry threshold value 226, write queue pending write count 228, read queue pending read count 230, write queue upper threshold value 232, write queue lower threshold value 234). The registers can store memory pointers, and/or fetched data, for instance. The registers can include input information, output information, and/or activation functions information, among other types of information, for use by the computing systems discussed herein. A number of embodiments provide that the registers can be read and/or written to based on commands from the host 202, for example. A number of embodiments provide that one or more registers can include information provided (e.g., assigned) by a manufacturer (e.g., a manufacturer of one or more of the memory components discussed herein).

Embodiments provide that the write queue timer 224 can be initiated (e.g., started) upon receiving a write request to the write queue 208, where the write queue 208 was previously empty. In other words, when the write queue 208 has zero write requests and a write request is received to the write queue 208, the write queue timer 224 can be initiated. Upon initiation, the write queue timer 224 can record an amount of time that has elapsed since the initiation of the write queue timer 224. The write queue timer 224 can be initiated (and reinitiated) from a beginning value (e.g., zero) from which the write queue timer 224 is incremented.

Embodiments provide that the write queue timer 224 has a write queue timer expiry threshold value 226. Embodiments provide that when the write queue timer reaches the write queue timer expiry threshold value 226, as discussed further herein, one or more write requests from the write queue 208 are executed (e.g., one or more write operations is performed).

The write queue timer expiry threshold value 226 can have different values for various applications. One or more embodiments provide that the write queue timer expiry threshold value 226 corresponds to a number of clock cycles. For instance, the write queue timer expiry threshold value 226 can be equal to 5 clock cycles, 10 clock cycles, 25 clock cycles, 50 clock cycles or 100 clock cycles, among other values.

One or more embodiments provide that the write queue timer expiry threshold value 226 can be a static value (e.g., the write queue timer expiry threshold value 226 is not increased and/or decreased in size as conditions and/or demands on the computing system are increased and/or decreased). One or more embodiments provide that the write queue timer expiry threshold value 226 can be a dynamic value (e.g., the write queue timer expiry threshold value 226 can be increased and/or decreased in size as conditions and/or demands on the computing system are increased and/or decreased).

Embodiments provide that the write queue pending write count 228, as discussed further herein, can be utilized to monitor a number of pending (e.g., yet to be executed) write requests in the write queue 208. One or more embodiments provide that when the write queue pending write count 228 is zero (e.g., there are no pending write requests in the write queue 208) the write queue timer 224 is off. One or more embodiments provide that when the write queue pending write count 228 is non-zero (e.g., there are pending write requests in the write queue 208) the write queue timer 224 is on.

Embodiments provide that the write queue 208 has a write queue lower threshold value 234 and a write queue upper threshold value 232. The write queue lower threshold value 234 and the write queue upper threshold value 232, as discussed further herein, can be utilized to determine when one or more write requests and/or when one or more read requests are to be executed.

The write queue lower threshold value 234 and the write queue upper threshold value 232 can have different values for various applications. One or more embodiments provide that the write queue lower threshold value 234 and/or the write queue upper threshold value 232 can be a static value (e.g., the value is not increased and/or decreased in size as conditions and/or demands on the computing system are increased and/or decreased). One or more embodiments provide that write queue lower threshold value 234 and/or the write queue upper threshold value 232 can be a dynamic value (e.g., the value can be increased and/or decreased in size as conditions and/or demands on the computing system are increased and/or decreased).

Embodiments provide that the read queue pending read count 230, as discussed further herein, can be utilized to monitor a number of pending (e.g., yet to be executed) read requests in the read queue 208. The read queue pending read count 230 can be utilized to determine when one or more write requests and/or when one or more read requests are to be executed.

Figures 1, 3:
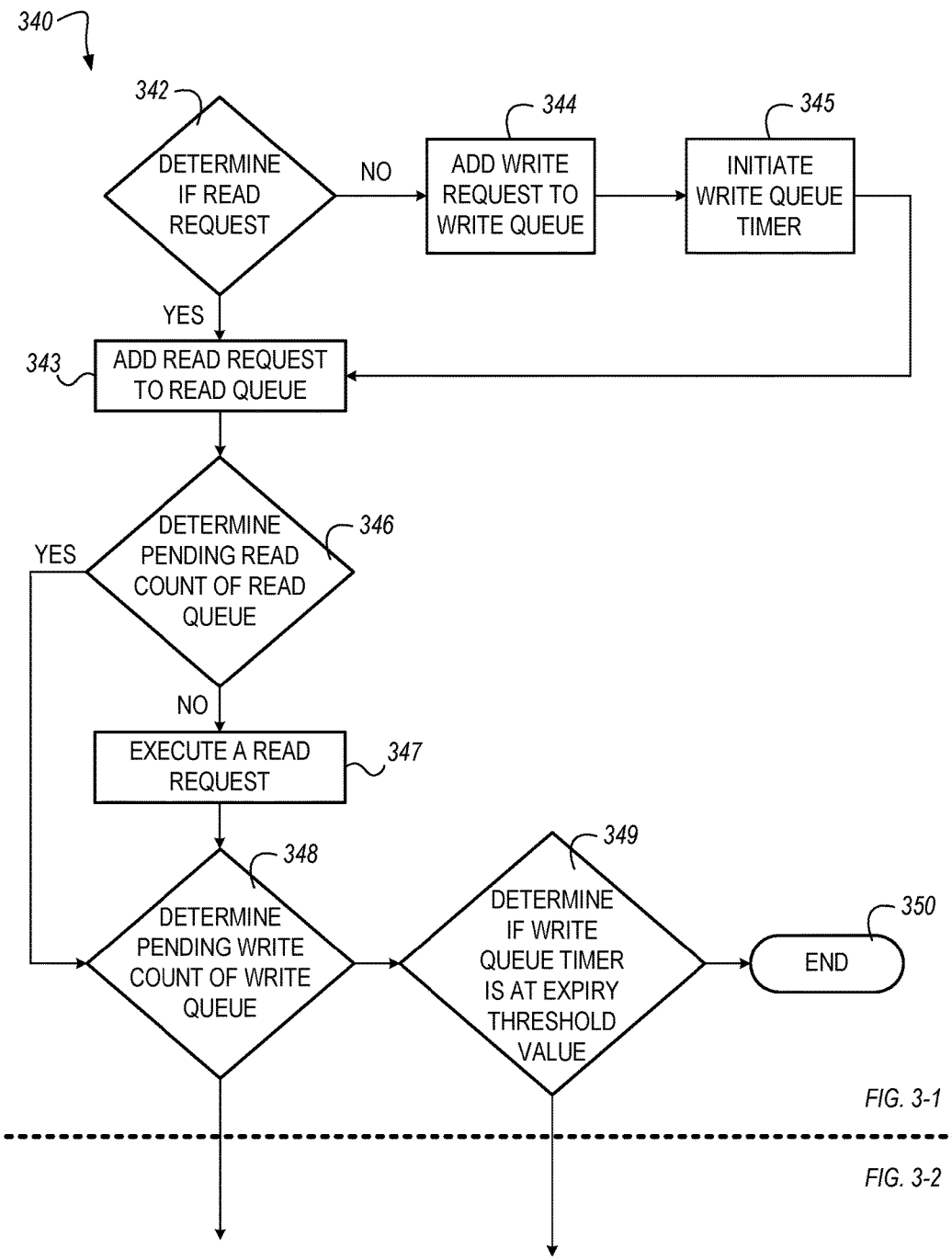
Figures 2, 3:
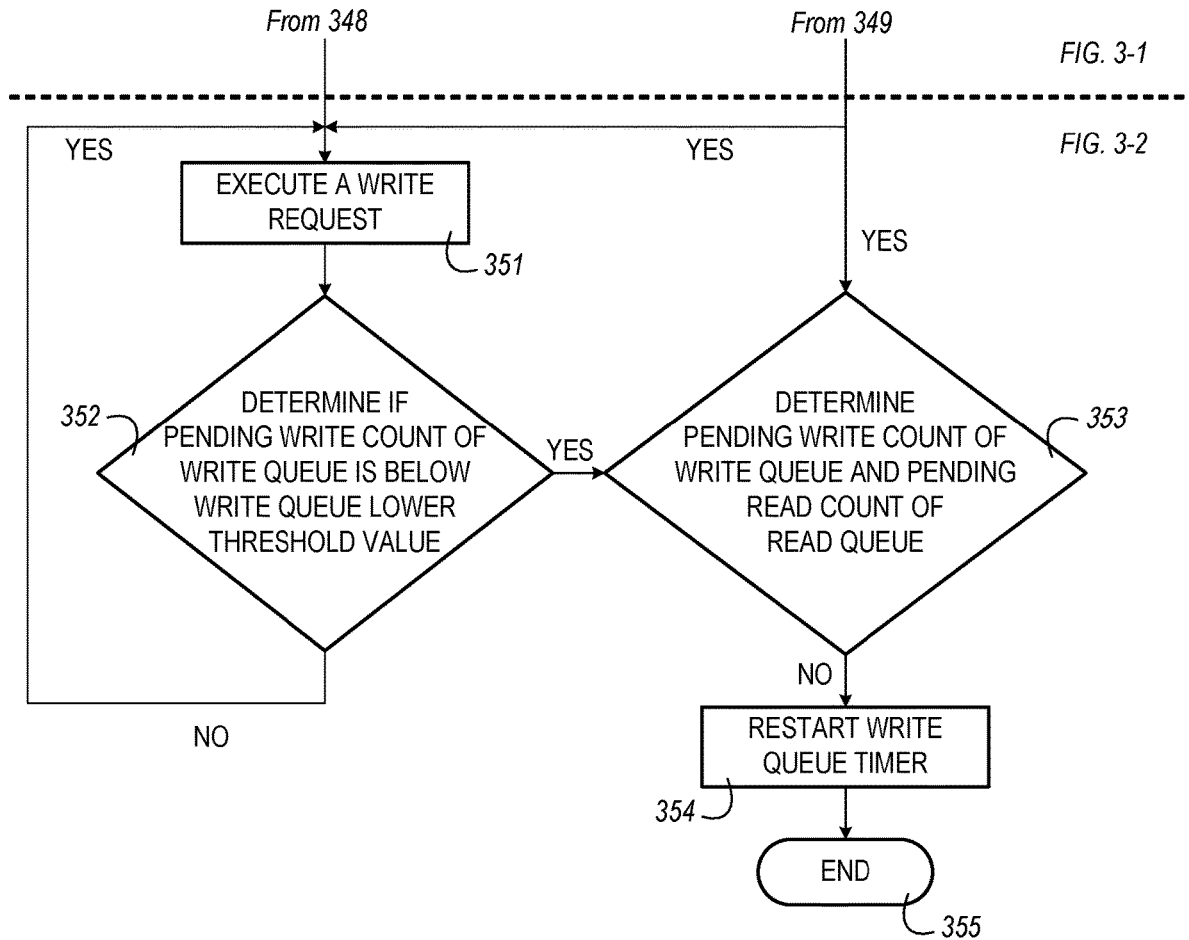

FIG. 3-1, 3-2 is flow diagram 340 corresponding to write request thresholding in accordance with some embodiments of the present disclosure. The flow 340 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 342, it can be determined if a received request is a read request. For instance, it can be determined if a received request is a read request rather than a write request.

At operation 343, when a received request has been determined to be a read request, the read request can be added to a read queue. As previously mentioned, embodiments provide that read requests are received to the read queue and write requests are received to a write queue.

At operation 344, a received request has been determined to not be a read request (e.g., the received request is a write request). The received request, being a write request, can be added to the write queue.

At operation 345, a write queue timer can be initiated (e.g., started), when the write request is added to the write queue. Initiation of the write queue timer is discussed further herein. One or more embodiments provide that the write queue timer is initiated only when a first write request is received to an empty write queue.

At operation 346, a pending read count of the read queue can be determined. For example, it can be determined if the read queue contains one or more pending read counts or if the read queue contains zero pending read counts.

At operation 347, a read request is executed when the pending read count of the read queue is determined, at operation 346, to contain one or more pending read requests. Execution of read requests can reduce read latency.

At operation 348, a pending write count of the write queue can be determined following operation 347 or when the pending read count of the read queue is determined to contain zero pending read requests (e.g., the read queue is empty). Determining the pending write count of the write queue can indicate if the pending write count of the write queue is equal to or greater than a write queue upper threshold value.

At operation 349, it can be determined if the write queue timer is at a write queue timer expiry threshold value when the pending write count of the write queue is not equal to or greater than a write queue upper threshold value (e.g., the pending write count of the write queue is less than the write queue upper threshold value). When the write queue timer is at (e.g., is equal to) the write queue timer expiry threshold value, a time interval has elapsed to provide an indication that a write request from the write queue is to be executed. As previously mentioned, the write queue timer expiry threshold value can have different values for various applications.

At operation 350, a portion of the flow 340 can end because the write queue timer is not at the write queue timer expiry threshold value. Because the write queue timer is not at the write queue timer expiry threshold value, no indication that a write request from the write queue is to be executed due to reaching the write queue timer expiry threshold value will be provided.

At operation 351, a write request from the write queue can be executed. The write request can be executed if the pending write count of the write queue is equal to or greater than the write queue upper threshold value, as determined at operation 348, or if the write queue timer is at the write queue timer expiry threshold value, as determined at operation 349. Executing the write request can provide that write starvation is avoided.

At operation 352, it can be determined if the pending write count of the write queue is below a write queue lower threshold value. For example, the pending write count of the write queue can be determined and compared to the write queue lower threshold value. If the write count of the write queue is not below a write queue lower threshold value, the flow 340 can return to operation 351, such that a write request from the write queue can be executed. If the write count of the write queue is below a write queue lower threshold value, the flow 340 can proceed to operation 353.

At operation 353, a pending write count of the write queue and a pending read count of the read queue can be determined. The method 340 can proceed to operation 354 if it is determined that there are zero pending read requests in the read queue (e.g., the read queue is empty) and there are one or more pending write requests in the write queue.

At operation 354, the write queue timer can be reinitiated (e.g., restarted from a beginning value from which the write queue timer is incremented). Reinitiating the write queue timer, so that one or more write requests are executed when the write queue timer expiry threshold value is reached, can provide that write starvation is avoided.

At operation 355, a portion of the flow 340 can end. At operation 355, as mentioned, the write queue timer has been reinitiated to provide that write starvation is avoided.

Figure 4:
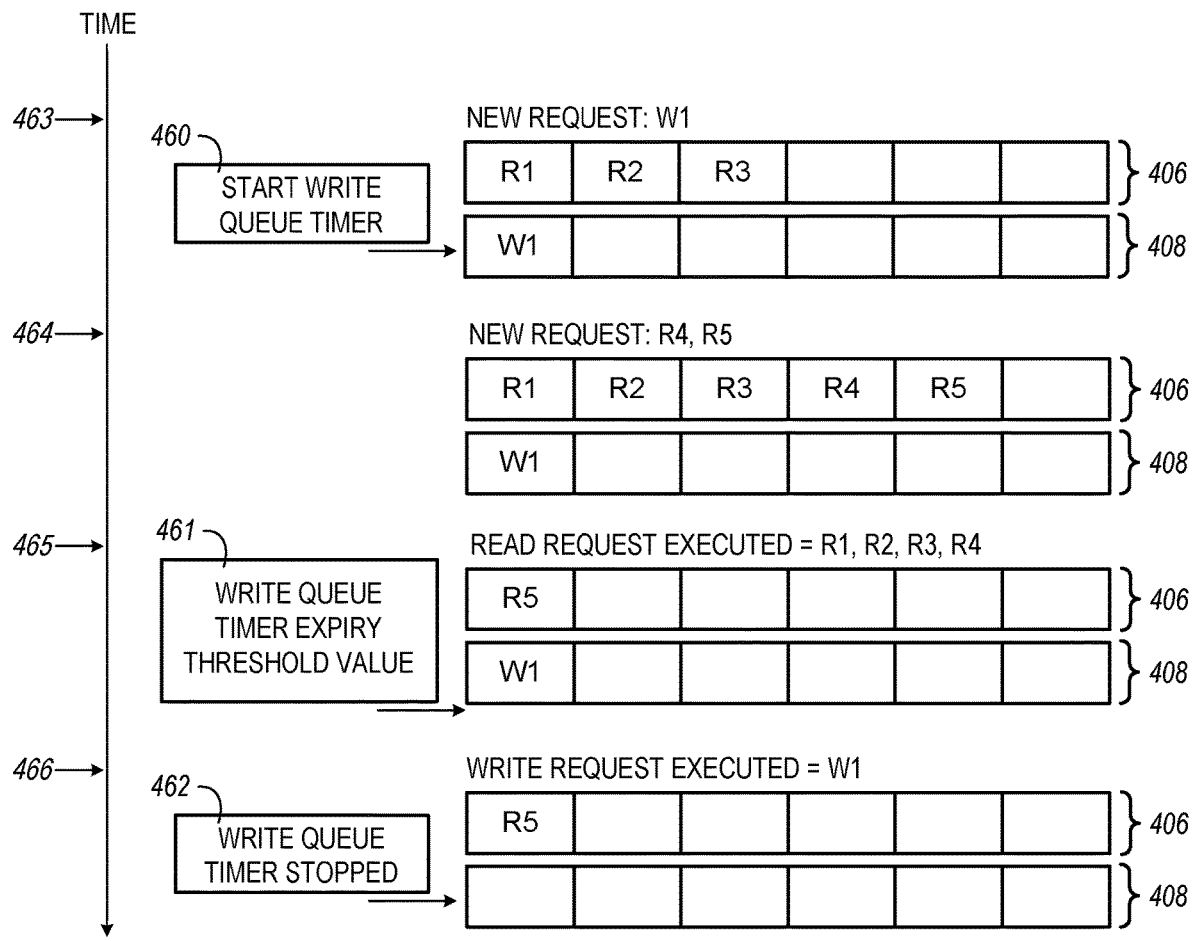
FIG. 4 illustrates a portion of an example computing system in accordance with some embodiments of the present disclosure.

FIG. 4 illustrates a portion of an example computing system in accordance with some embodiments of the present disclosure. FIG. 4 illustrates read request queue 406 and write request queue 408 at four different times. For the four different times, time 463 is the first (e.g., earliest) time; time 464 is a later time than time 463; time 465 is a later time than time 463 and time 464; and time 466 is a later time than time 463, time 464, and time 465. In other words, time proceeds from time 463 to time 464 to time 465 to time 466. For FIG. 4, the pending write count of the write queue 408 is not equal to or greater than the write queue upper threshold value at any time 463, time 464, time 465, or time 466.

At time 463, a new write request W1 is received to write request queue 408. The newly received write request W1 changes the pending write count of the write queue from zero (prior to receiving write request W1) to one. As shown by operation 460, the write queue timer is initiated upon received write request W1 at time 463. Further, at time 463, read request queue 406 includes three read requests R1, R2, R3, such that the pending read count of the read request queue 406 is three.

At time 464, two new read requests R4, R5, as compared to time 463, are received to read request queue 406. At time 464, the write queue timer has incremented from time 463 to time 464. As the write queue timer is incremented, the write queue timer approaches a write queue timer expiry threshold value.

At time 465, read requests R1, R2, R3, R4 have been executed and are no longer pending read requests in read queue 406; read request R5 remains a pending read request in read queue 406. As the number of read requests has changed, from time 464 to time 465, from five (R1, R2, R3, R4, R5) to one (R5), the pending read count of the read queue 406 has been reduced by executing read requests. Executing read requests reduces read latency. Further at time 465 as shown by operation 461, the write queue timer expiry threshold value is reached while write request W1 is a pending write request in the write queue 408.

At time 466, write request W1 has been executed, as indicated by zero pending write requests in write queue 408, due to the write queue timer reaching the write queue timer expiry threshold value, while read request R5 remains a pending read request in read queue 406. Executing one or more write requests in the write queue 408 when the write queue timer expiry threshold value is reached can provide that write starvation is avoided. Further at time 466 as shown by operation 462, the write queue timer is stopped (e.g., the write queue timer is not reinitiated) as the write queue 408 has zero pending write requests. Thereafter, as the write queue 408 has zero pending write requests, the next request to be executed will be read request R5 from read queue 406.

Figure 5:
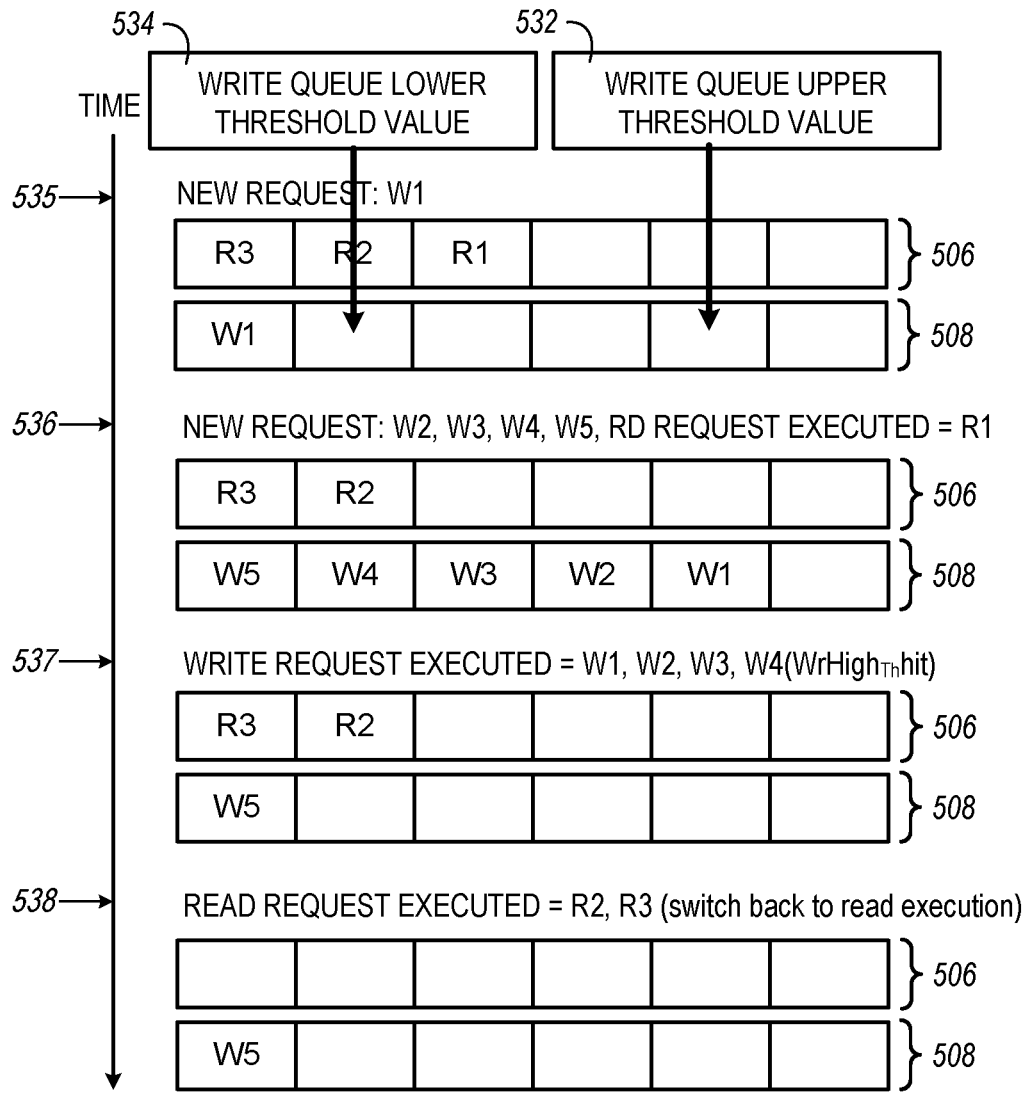
FIG. 5 illustrates a portion of an example computing system in accordance with some embodiments of the present disclosure.

FIG. 5 illustrates a portion of an example computing system in accordance with some embodiments of the present disclosure. FIG. 5 illustrates read request queue 506 and write request queue 508 at four different times. For the four different times, time 535 is the first (e.g., earliest) time; time 536 is a later time than time 535; time 537 is a later time than time 535 and time 536; and time 538 is a later time than time 535, time 536, and time 537. In other words, time proceeds from time 535 to time 536 to time 537 to time 538. For FIG. 5, the write queue timer is initiated at time 535 when a new write request W1 is received to write request queue 508; however, the write queue timer expiry threshold value is not reached at time 535, time 536, time 537, or time 538.

At time 535 as mentioned, a new write request W1 is received to write request queue 508. The newly received write request W1 changes the pending write count of the write request queue 508 from zero (prior to receiving write request W1) to one. As shown at time 535, the pending write count in write request queue 508 is less than the write queue lower threshold value 534 and is less than the write queue upper threshold value 532. At time 535, there are three pending read requests R1, R2, R3 in read queue 506.

At time 536, four new write requests W2, W3, W4, W5 have been received to write queue 508. These four write requests increment the pending write queue count beyond the write queue lower threshold value 534 such that the pending write queue count is equal to the write queue upper threshold value 532, as shown in FIG. 5. Also, at time 536, read request R1 has been executed (e.g., up to time 536 read requests are being executed (prioritized as compared to write requests) because one or more of the following conditions is not met: the read queue contains zero pending read requests; the write queue timer has reached the write queue timer expiry threshold value; the pending write count is equal to or greater than the write queue upper threshold value 532) and is no longer a pending read request in read queue 506. Because the four new write requests W2, W3, W4, W5 have been received to write queue 508, as shown at time 536, such that the pending write queue count is equal to the write queue upper threshold value 532, read prioritization (e.g., executing read requests) is suspended for write prioritization (e.g., executing write requests). At a later time, when write prioritization conditions as discussed herein have been satisfied (e.g., by executing one or more write requests), write prioritization is suspended for read prioritization.

At time 537, write requests W1, W2, W3, W4, have been executed such that the pending write request count of the write queue 508 is less than the write queue lower threshold value 537. The write requests W1, W2, W3, W4, have been prioritized (e.g., executed) as compared to the pending read requests R2, R3 in the read queue 506.

At time 538, read requests R2, R3 have been executed and pending write request W5 remains in the write queue 508. The read requests R2, R3 have been prioritized, as compared to pending write request W5, because at time 537 the execution of pending write requests provided that the pending write request count of the write queue 508 is less than the write queue lower threshold value 537, thus shifting request prioritization from write request to read requests. As a result, read latency is reduced, while write starvation is avoided.

Figure 6:
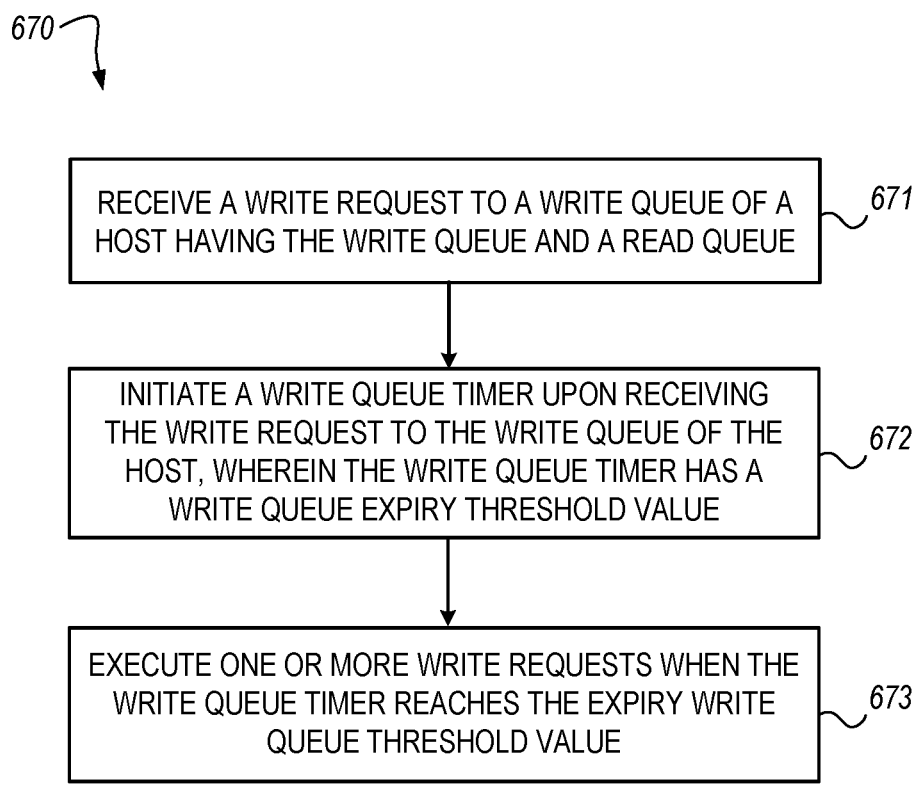
FIG. 6 is a flow diagram corresponding to a method for write request thresholding in accordance with some embodiments of the present disclosure.

FIG. 6 is a flow diagram corresponding to a method 670 for write request thresholding in accordance with some embodiments of the present disclosure. The method 670 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 671, a write request can be received to a write queue of a host having the write queue and a read queue. Some embodiments provide that the write request can be received from a traffic generator, for instance. Similarly, read requests can be received to the read queue.

At operation 672, a write queue timer can be initiated upon receiving the write request to the write queue of the host, wherein the write queue timer has a write queue timer expiry threshold value. As mentioned, the write queue timer expiry threshold value can have different values for various applications. Some embodiments provide that the write queue timer is dynamic (e.g., the write queue timer expiry threshold value can change as resources of the computing system change). Some embodiments provide that the write queue timer is static (e.g., the write queue timer expiry threshold value is maintained at a particular value as resources of the computing system change).

At operation 673, one or more write requests can be executed with the write queue timer reaches the write queue timer expiry threshold value. As mentioned, executing one or more write requests when the write queue timer reaches the write queue timer expiry threshold value can avoid write starvation.

In some embodiments, the method 670 can include that a pending read count of the read queue is determined upon the write queue timer reaching the write queue timer expiry threshold value. The pending read count of the read queue can indicate if any pending read requests are in the read queue. Some embodiments provide that the pending read count of the read queue is determined at a regular time interval (e.g., the pending read count of the read queue can be determined every five seconds, among other values). Some embodiments provide that the pending read count of the read queue is determined each time a request (e.g., a read request or a write request) is received the read queue or the write queue.

In some embodiments, the method 670 can include that a pending write count of the write queue is incremented upon receiving the write request to the write queue, wherein the write queue has a write queue lower threshold value and a write queue upper threshold value. Incrementing the pending write count of the write queue can indicate the number of pending write requests in the write queue. The number of pending write requests in the write queue can be utilized to determine if the number of pending write requests in the write queue is equal to, less than, or greater than the write queue lower threshold value and/or the write queue upper threshold value.

In some embodiments, the method 670 can include that one or more write requests are executed when the pending write count of the write queue is greater than the write queue lower threshold value. A number of write requests in the write queue (e.g., when the pending write count of the write queue is greater than the write queue lower threshold value) can indicate that the computing system is near a write starvation condition. As discussed herein, a number of embodiments provide that one or more write requests are executed when the pending write count of the write queue is greater than the write queue lower threshold value, including when the pending write count of the write queue is equal to the write queue upper threshold value (which is greater than the write queue lower threshold value).

In some embodiments, the method 670 can include that one or more write requests are executed when the pending write count of the write queue is greater than the write queue lower threshold value reduces the pending write count of the write queue to the write queue lower threshold value. Further, one or more write requests can be executed to reduce the number of number of pending write requests in the write queue to a pending write count that a value that is less than the write queue lower threshold value. Reducing a number of pending write counts of the write queue can avoid write starvation.

Figure 7:
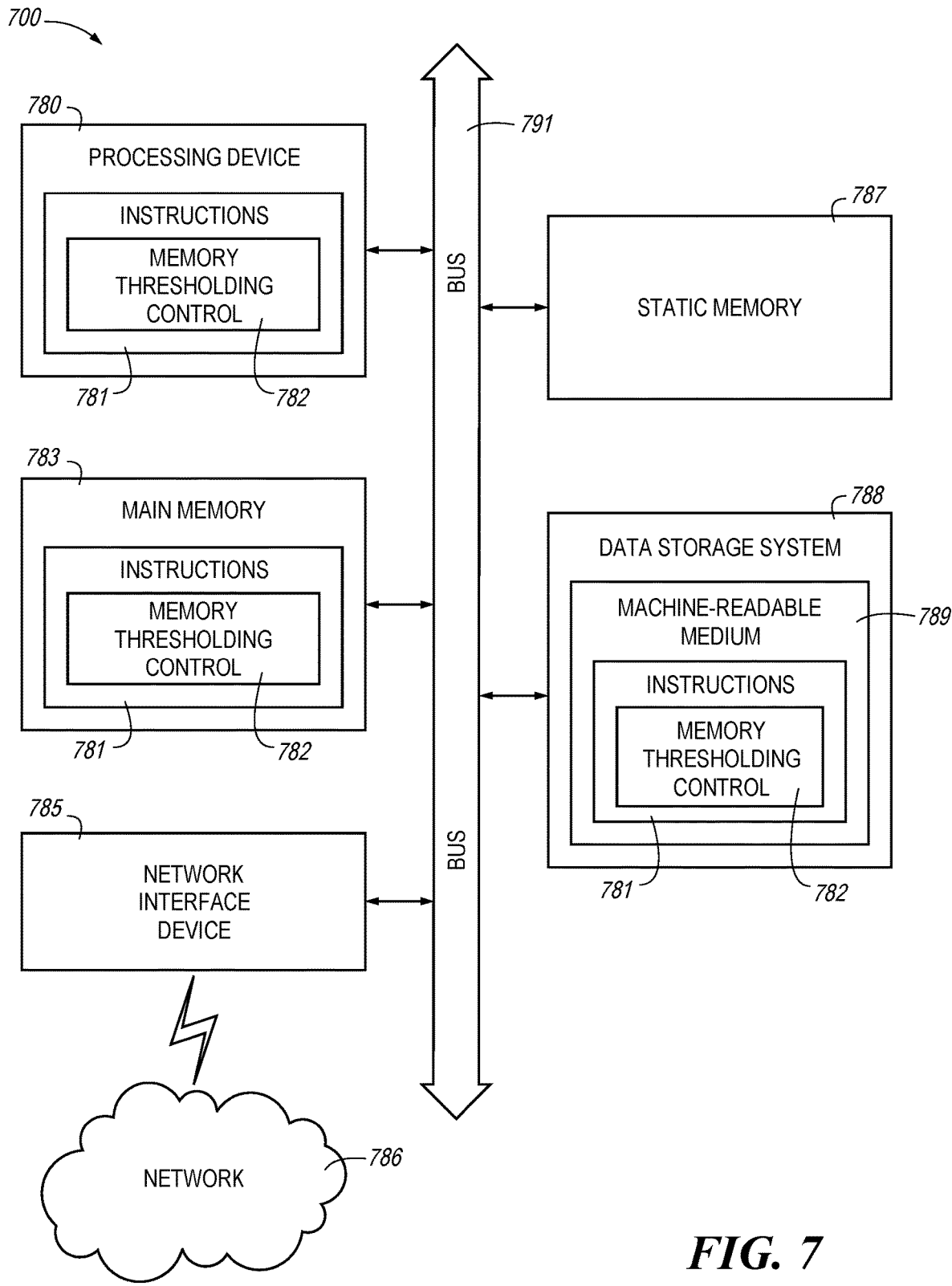
FIG. 7 is a block diagram of an example computer system in which embodiments of the present disclosure may operate.

FIG. 7 is a block diagram of an example computer system 700 in which embodiments of the present disclosure may operate. For example, FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to execute an operating system to perform operations corresponding to the write request thresholding, as discussed herein). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 780, a main memory 783 (e.g., read-only memory (ROM), flash memory, dynamic random access memory (DRAM) such as synchronous DRAM (SDRAM) or Rambus DRAM (RDRAM), etc.), a static memory 787 (e.g., flash memory, static random access memory (SRAM), etc.), and a data storage system 788, which communicate with each other via a bus 791.

The processing device 780 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 780 can also be one or more special-purpose processing devices such as an application specific integrated circuit (ASIC), a field programmable gate array (FPGA), a digital signal processor (DSP), network processor, or the like. The processing device 780 is configured to execute instructions 781 for performing the operations and steps discussed herein. The computer system 700 can further include a network interface device 785 to communicate over the network 786.

The data storage system 788 can include a machine-readable storage medium 789 (also known as a computer-readable medium) on which is stored one or more sets of instructions 781 or software embodying any one or more of the methodologies or functions described herein. The instructions 781 can also reside, completely or at least partially, within the main memory 783 and/or within the processing device 780 during execution thereof by the computer system 700, the main memory 783 and the processing device 780 also constituting machine-readable storage media. The machine-readable storage medium 789, data storage system 788, and/or main memory 783 can correspond to the memory sub-system 104 of FIG. 1.

In one embodiment, the instructions 781 include instructions to implement functionality corresponding to write request thresholding, as discussed herein. While the machine-readable storage medium 789 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
receiving a write request to a write queue of a host having the write queue and a read queue;
initiating a write queue timer upon receiving the write request to the write queue of the host, wherein the write queue timer has a write queue timer expiry threshold value;
executing one or more write requests when the write queue timer reaches the write queue timer expiry threshold value,
determining a pending read count of the read queue upon the write queue timer reaching the write queue timer expiry threshold value; and
executing each write request in the write queue when the pending read count of the read queue is zero.

2. An apparatus, comprising:
a controller configured to:
increment a pending write count of a write queue of a host upon receiving a write request to the write queue, wherein the write queue has a write queue lower threshold value and a write queue upper threshold value;
initiate a write queue timer upon receiving the write request to the write queue, wherein the write queue timer has a write queue timer expiry threshold value; and
reduce the pending write count of a write queue from the write queue upper threshold value to the write queue lower threshold value prior to the write queue timer reaching the write queue timer expiry threshold value.

3. The apparatus of claim 2, wherein the controller is further configured to determine a pending read count of the read queue of the host.

4. The apparatus of claim 3, wherein the controller is further configured to reduce the pending write count of the write queue from the write queue upper threshold value to zero, prior to the write queue timer reaching the write queue timer expiry threshold value, when the pending read count of the read queue is zero.

5. The apparatus of claim 2, wherein the controller is further configured to reduce the pending read count of the read queue when the read count of the read queue is greater than zero and the write count of the write queue is equal to or less than the write queue lower threshold.

6. The apparatus of claim 2, wherein the controller is further configured to reduce the pending write count of the write queue to the write queue lower threshold value when the write queue timer reaches the write queue timer expiry threshold value.

7. The apparatus of claim 6, wherein the controller is further configured to reinitiate the write queue timer after the write queue timer expiry threshold value has been reached and the write count of the write queue is below the write queue lower threshold value.

8. The apparatus of claim 6, wherein the write queue timer is reinitiated after the write queue timer expiry threshold value has been reached and after the pending write count of a write queue is incremented from zero to one.

9. A system, comprising:
a plurality of memory components;
a processing device coupled to the plurality of memory components;
a write queue coupled to the processing device; and
a read queue coupled to the processing device, wherein the processing device is to perform operations comprising:
receiving a write request to the write queue;
initiating a write queue timer upon receiving the write request to the write queue, wherein the write queue timer has a write queue timer expiry threshold value;
determining a pending read count of the read queue after the write queue timer is initiated; and
reducing the pending read count of the read queue when the read count of the read queue is greater than zero prior to the write queue timer reaching the write queue timer expiry threshold value.

10. The system of claim 9, wherein the processing device is to perform operations comprising determining if a pending write count of the write queue is within a write queue lower threshold value and a write queue upper threshold value.

11. The system of claim 10, wherein the pending write count of the write queue is reduced when the pending write count of the write queue is greater than or equal to the write queue upper threshold value.

12. The system of claim 11, wherein the pending write count of the write queue is reduced to the write queue lower threshold value.

13. The system of claim 9, wherein the pending write count of the write queue is reduced when the pending write count of the write queue is greater than zero and the write queue timer reaches the write queue timer expiry threshold value.

14. The system of claim 9, wherein the processing device is to perform operations comprising reinitiating the write queue timer after the write queue timer expiry threshold value has been reached, the write count of the write queue is below the write queue lower threshold value, and a subsequent write request to the write queue of the controller is received.

15. The system of claim 9, wherein the system is Compute Express Link (CXL) compliant.

16. A method, comprising:
receiving a write request to a write queue of a host having the write queue and a read queue;
initiating a write queue timer upon receiving the write request to the write queue of the host, wherein the write queue timer has a write queue timer expiry threshold value;
executing one or more write requests when the write queue timer reaches the write queue timer expiry threshold value; and
incrementing a pending write count of the write queue upon receiving the write request to the write queue, wherein the write queue has a write queue lower threshold value and a write queue upper threshold value.

17. The method of claim 16, further comprising executing one or more write requests when the pending write count of the write queue is greater than the write queue lower threshold value.

18. The method of claim 17, wherein executing one or more write requests when the pending write count of the write queue is greater than the write queue lower threshold value reduces the pending write count of the write queue to the write queue lower threshold value.

* * * * *